United States Patent [19]
Kagayama

[11] Patent Number: 5,353,094
[45] Date of Patent: Oct. 4, 1994

[54] IMAGE RECORDING APPARATUS

[75] Inventor: Shigeru Kagayama, Owariasahi, Japan

[73] Assignee: Brother Kogyo Kabushiki Kaisha, Nagoya, Japan

[21] Appl. No.: 59,271

[22] Filed: May 11, 1993

[30] Foreign Application Priority Data

Jun. 15, 1992 [JP] Japan .................................. 4-155225

[51] Int. Cl.$^5$ ............................................ G03D 13/00
[52] U.S. Cl. ..................................... 355/27; 346/76 L; 355/100; 355/245; 430/138
[58] Field of Search ................. 355/27, 100, 245, 326, 355/327, 271–277, 50, 70; 430/138, 109; 346/76 L, 138, 160, 108

[56] References Cited

U.S. PATENT DOCUMENTS

| | | | |
|---|---|---|---|
| 4,801,949 | 1/1989 | Misono et al. | 346/76 L |
| 4,865,943 | 9/1989 | Wright | 430/138 |
| 4,876,290 | 10/1989 | Vivant | 521/76 |
| 4,891,172 | 1/1990 | Matsushita | 264/4.33 |
| 4,898,696 | 2/1990 | Sliwka | 264/4.7 |
| 5,060,020 | 10/1991 | Sakai | 355/245 |
| 5,153,634 | 10/1992 | Sanders et al. | 355/27 |

FOREIGN PATENT DOCUMENTS 3-77961 4/1991 Japan .
3-80258 4/1991 Japan .
5-61171 3/1993 Japan .

Primary Examiner—A. T. Grimley
Assistant Examiner—T. A. Dang
Attorney, Agent, or Firm—Oliff & Berridge

[57] ABSTRACT

A hydrophilic member is coated on the recording drum of an image recording apparatus which uses photosensitive microcapsule toner. The photosensitive microcapsule toner particles each have a hydrophilic wall and hydrophobic contents. When an image is developed with pressure, the wall remains on the recording drum since moisture in the air is absorbed in the hydrophilic member. The contents do not adhere to the recording drum because of its hydrophobic feature. Therefore, a clear image can always be obtained without transferring unnecessary materials onto an image receiving paper.

24 Claims, 5 Drawing Sheets

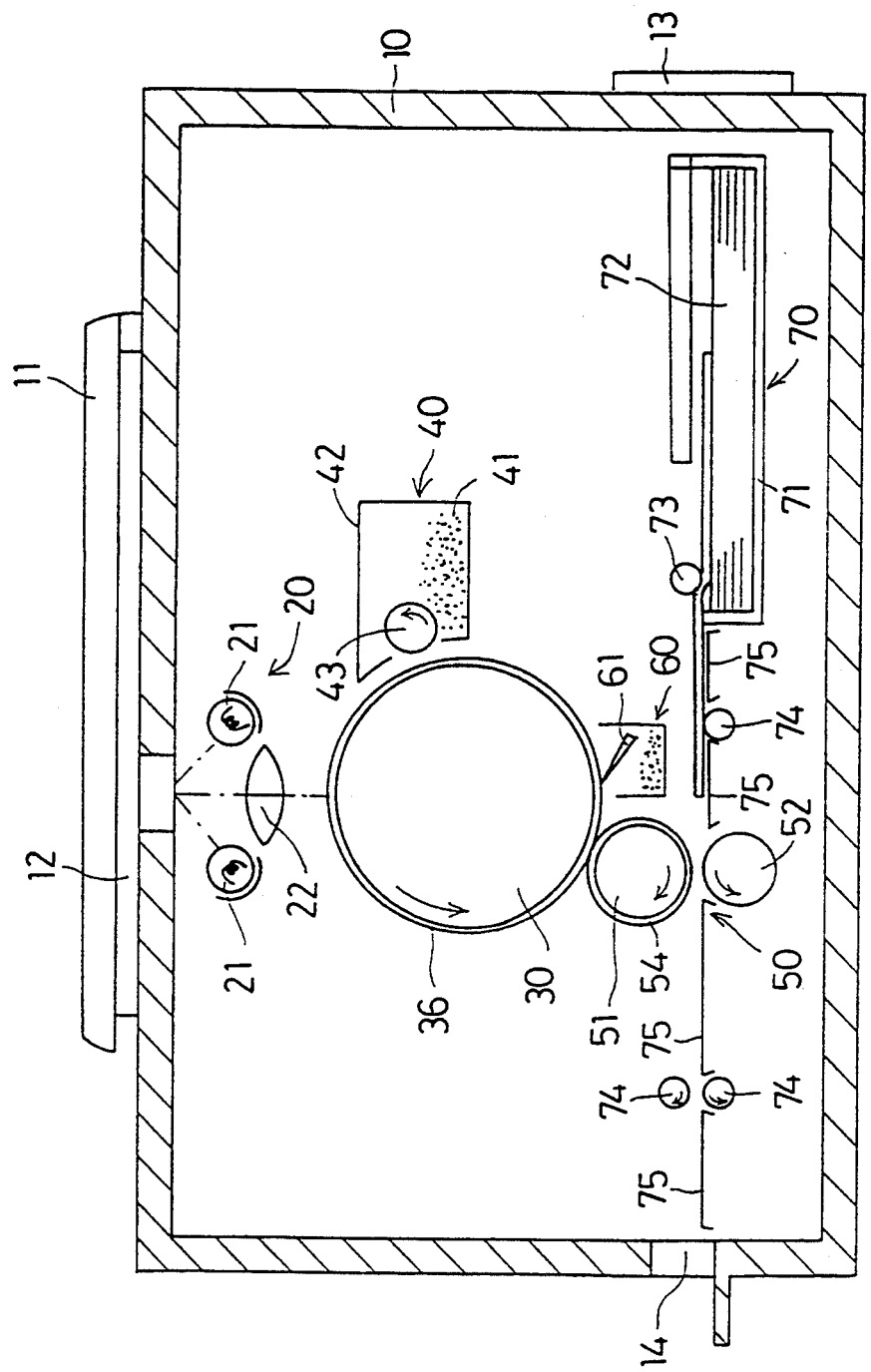

IMAGE RECORDING APPARATUS

BACKGROUND OF THE INVENTION

1. Field of the Invention

The present invention relates to an image recording apparatus such as a copier or a printer.

2. Description of Related Art

Japanese Patent Laid-Open Publication No. 3-77961 and Japanese Patent Laid-Open Publication No. 3-80258 have disclosed microcapsule fine particles in which coloring materials such as dye pigments and photo hardening materials are confined in the wall thereof and change their mechanical strength in responsive to light.

An image recording apparatus used with microcapsule toner is disclosed in U.S. Pat. No. 5,060,020. In this recording apparatus, after the microcapsule toner is exposed, only the microcapsule toner particles which are not hardened are ruptured by pressure applied thereto. Then, coloring materials confined in the microcapsule toner particles flow out. When the flowing coloring materials are transferred onto an image receiving paper, an image is formed on the image receiving paper.

The above image recording apparatus comprises toner supplying means for charging the microcapsule toner, supporting the charged microcapsule toner on carrying means and supplying the microcapsule toner onto drum by an electrostatic force. The apparatus also includes exposing means for exposing the microcapsule toner according to image information and microcapsule rupturing means for rupturing the microcapsules of the microcapsule toner to cause the coloring materials to flow from the microcapsule toner.

In the image recording apparatus, when the microcapsule toner particles are ruptured by the rupturing means, the walls of the microcapsule toner particles are transferred onto the image receiving paper as well as the contents such as the coloring materials. There has been a problem that a fine image result cannot be obtained due to the transfer of the walls onto the image receiving paper since the walls are not colorless or transparent.

In order to solve the above-mentioned and other problems, Japanese Laid-Open Publication No. 05-61171 proposes preventing the wall of the microcapsule toner particles from moving onto the image receiving paper by covering adhesive materials on the image supporting part. This applicant has also proposed preventing the wall of the microcapsule toner particles from moving onto the image receiving paper by making the surface of the image supporting medium more rough than that of the image receiving material.

However, in the image recording apparatus with the above-mentioned structure, the walls of the microcapsules could not be prevented completely from moving to the image recording paper.

Moreover, there are various problems due to the adhesion of the contents of the microcapsules onto the drum. It has been desired that the contents never remain on the drum and that the walls of the microcapsule toner particles should be fixed on the drum.

SUMMARY OF THE INVENTION

Therefore, an object of the present invention is to provide an image recording apparatus being capable of forming clear images without transferring the walls of the microcapsule toner particles which are ruptured by the rupturing means.

In order to achieve the above and other objects, the image recording apparatus of the present invention comprises an image recording medium, the image supporting medium having microcapsule toner particles coated thereon, each said microcapsule toner particle comprising a microcapsule wall and flowable contents contained therein; exposure means for forming a latent image of an original on said image supporting medium by hardening selected microcapsule toner particles corresponding to an image of the original; and pressure developing means for applying pressure to said image supporting medium to rupture non-hardened microcapsule toner particles coated on said image supporting medium, wherein the hardened microcapsules and the ruptured microcapsule toner walls remain on said image supporting medium while only the flowable contents are transferred to said image recording medium.

With the image recording apparatus of the present invention, the flowable toner contents have a different reaction towards water than the image supporting medium and the walls of the microcapsule toner particles. That is, the image supporting medium and the walls of the microcapsule toner particles are attractive to water and the contents, on the other hand, are repulsive to water. Therefore, the contents never adhere to the image supporting medium although the wall adheres to the image supporting medium.

The walls and the contents of the hardened microcapsule toner remain on the image supporting medium and are not transferred onto the image recording medium. As a result, a clear image can be formed only by the contents. As is clear from the above explanation, in the image recording apparatus of the present invention, the contents have a different reaction towards water than the image supporting medium and the walls of the microcapsule toner particles. The image supporting medium and the walls of the microcapsule toner particles are attractive to water, while the contents are repulsive to water. The walls adhere to the image supporting medium, while the contents do not adhere to the image supporting medium.

Therefore, the walls of the microcapsules and the contents of the hardened microcapsule toner remain on the drum and are not transferred onto the image receiving paper. As a result, a clear desired image can be formed on the image receiving paper only by the contents.

BRIEF DESCRIPTION OF THE DRAWINGS

Preferred embodiments of the present invention will be described in detail with reference to the following figures wherein:

FIG. 5 is a schematic side elevational view of the image recording apparatus of the third embodiment.

DETAILED DESCRIPTION OF PREFERRED EMBODIMENTS

The first embodiment of the present invention is explained by referring the accompanying drawings.

Figure 1:
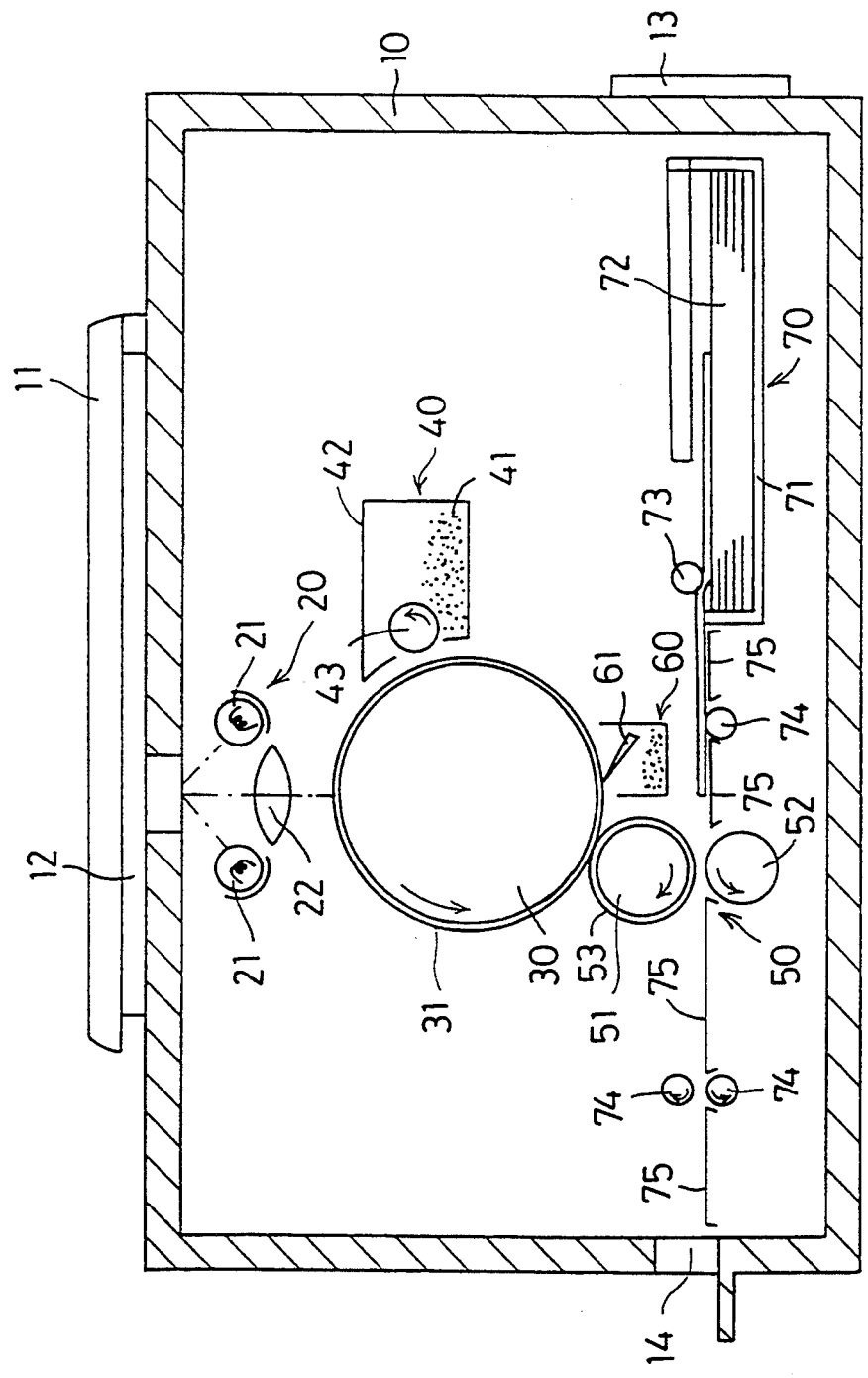
FIG. 1 is a schematic side elevational view of the image recording apparatus of the first embodiment.

FIG. 1 is a schematic side elevational view showing the structure of the image recording apparatus of the present invention. An original document 12 and a cover 11 are installed on a frame 10 of the image recording apparatus. A sheet entrance 13 and a sheet outlet 14 are arranged on the side of the apparatus.

Inside the apparatus, photosensitive microcapsule toner 41 is coated on a recording drum 30 with a electrostatic force. After the photosensitive microcapsule toner 41 is exposed, pressure is applied to the photosensitive microcapsule toner 41 to transfer an image onto an image receiving paper. An exposing unit 20 is arranged under the original document 12 which is located in the upper side of the apparatus. The exposing unit 20 comprises a lamp 21 and an image formation lens 22. As for the lamp 21, a halogen lamp or a halide lamp can be used in accordance with the sensitivity of the photosensitive microcapsule toner.

A recording drum 30 is arranged at the center of the apparatus. The drum 30 is made from a light alloy such as aluminum. A hydrophilic member 31 is coated on the surface of the drum 30 preferably with a thickness of about 100 $\mu$m or more than 100 $\mu$m. As for the hydrophilic member 31, preferably a resin material including a hydrophilic radical such as hydroxyl group, carboxyl group, amino group, ketone group, and sulfone radical is selected. As for the material for the hydrophilic member 31, preferably polyurethane, polyamide, polytetra methylen hexamethlene urethane and cellulose acetate are used.

Hereafter, the hydrophilic materials have a contact angle with water from 0° to 90°, and the hydrophobic materials have a contact angle with water from 90° to 180°.

The recording drum 30 is rotatable in the counter-clockwise direction in FIG. 1. The surface of the drum 30 can support photosensitive microcapsule toner easily.

A toner coating unit 40 for supplying photosensitive microcapsule toner 41 to the drum 30, a developing unit 50, and a cleaning unit 60 are arranged around the drum 30. The toner coating unit 40 comprises a case 42 where photosensitive microcapsule toner 41 is stored and a carrying roller 43. The carrying roller 43 is, for example, a roller made of metal which is coated with resin on the surface thereof.

Figure 2:
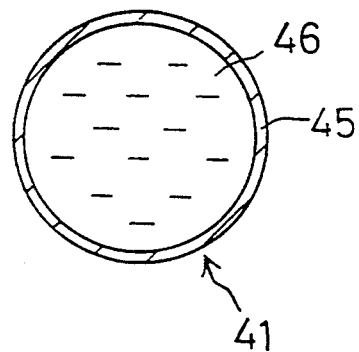
FIG. 2 is a cross-sectional view of the photosensitive microcapsule toner used in the image recording apparatus of the first embodiment.

The photosensitive microcapsule toner 41 comprises a wall 45 and contents 46 as shown in FIG. 2. The contents 46 are confined within the wall 45, and each photosensitive microcapsule toner 41 is almost globular. Preferably, the particle diameter of each photosensitive microcapsule toner 41 is about 10 $\mu$m. The particle diameter is determined based on the image resolution and gradation. The value of 10 $\mu$m is not fixed and photosensitive microcapsule toner 41 of a submicron diameter can be used.

The contents 46 comprise a photo hardening material which generates physical change such as hardening in response to a predetermined wavelength and a sensitizing pigment which colors images. The wall 45 is formed by a resin material including a hydrophilic radical, and the contents 46 are formed by an oil hydrophobic radical.

Polymerization compound can be used as the photo hardening material. For example, N-vinyl-2-pyrrolidone, bisphenol A diacrylate and methacrylate, the tripropylene glycol diacrylate and methacrylate, polyethylene glycol di(meth)acrylate and methacrylate, pentaerythritol triacrylate and methacrylate, dipentaerythritol hexaacrylate and methacrylate, trimethylolpropane tri(meth)acrylate and methacrylate and oligo ester (meth)acrylate and methacrylate can be used as the polymerization compound. In general, these materials are hydrophobic. Either one kind of the polymerization compound can be used, or more than two kinds of mixed compound can be used. Usually the polymerization compound is used in combination with photopolymerization initiators.

The photopolymerization initiators initiate the polymerization of resin in response to light. For example, benzoyl alkyl ether group such as benzophenone and benzoyl isopropyl ether, Michler's ketone, metal arene compound and 2, 4-diethylthioxanthone can be used as the photopolymerization initiator. The above-mentioned photopolymerization initiator is hydrophobic.

As for coloring materials, any dye pigments can be used. For example, azo dye, diphenylmethane color, triphenylmethane dye, phthalocyanine dye, acridine dye, and nitroso color can be used for hydrophilic dye and anthraquinone dye and nitro dye can be used for hydrophobic dye. As for the pigment, the following materials can be used. As for the hydrophilic pigment, inorganic pigments such as chrome yellow, red iron oxide, titanium oxide, and molybdate orange can be used. As for hydrophobic pigments, organic pigments and carbon black can be used.

The contents 46 comprise the photo hardening materials and dye. The percentage of the photo hardening material is large, while that of the dye is very small. For example, the ratio of the dye is 0.5 percent of the whole. Since the feature of the contents 46 are determined by the feature of photo hardening materials, usually the contents are hydrophobic irrespective of the use of hydrophilic dye or hydrophobic dye.

As for the wall 45, materials generally used for microcapsules are used. The microcapsules are formed by methods such as the interfacial polymerization method, the dissolving reaction method, the phase separation method, the interfacial sedimentation method, the spray drying method, and the fluidized bed method. As for materials for the hydrophilic wall, polyamide, melamine resin can be used. As for materials for the hydrophobic wall, poly (N, N-L-lysine diylterephthalyl) and alginic acid base can be used.

The photosensitive microcapsule toner 41 is a full color toner which hardens in response to each light wave length of RGB (red, green, blue) and colors cyan, magenta, and yellow.

In the image recording apparatus, the developing part 50 is arranged under the drum 30. The developing part 50 comprises a pressure roller 51 for pressurizing toner and thus developing images by closely confronting the recording drum 30 and transfer roller 52 disposed in the paper feeding path.

A cleaning unit 60 for cleaning the drum 30 is disposed under the recording drum 30. A blade 61 is disposed in the cleaning unit 60.

A paper feeding unit 70 is arranged at the bottom of the image recording apparatus. The paper feeding unit 70 comprises image receiving medium 72, such as paper, stored in a cassette 71, a sending roller 73 disposed above the cassette 71, a feeding guide 75 as a paper feeding path of the image receiving paper 72 and a feeding roller 74 for feeding the image receiving paper 72 into the feeding guide 75.

Next, operation of the preferred embodiment is explained. A user sets an original document 12 under the cover 11 and starts the operation of the apparatus. Accordingly, the photosensitive microcapsule toner 41 is coated on the recording drum 30 by the carrying roller 43 which forms the toner coating unit 40. The photosensitive microcapsule toner 41 is coated on the drum 30 with a thickness of about 10 μm.

The operation of the toner coating unit 40 is explained with reference to FIGS. 3(a)-3(e). FIGS. 3(a)-(e) are explanatory views showing that the photosensitive microcapsule toner 41 is coated onto the drum 30 and an image is formed on the image receiving paper 72.

Figure 3A:
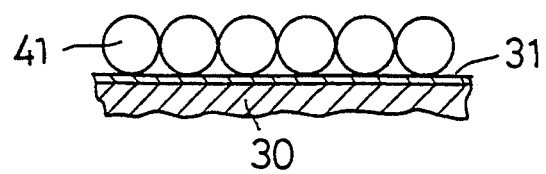
FIG. 3(a) is a cross-sectional view showing that the photosensitive microcapsule toner is coated on the surface of the recording drum.
Figure 3B:
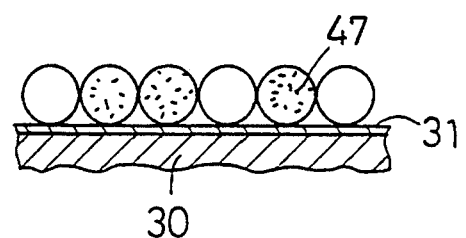
FIG. 3(b) is a cross-sectional view showing that the photosensitive microcapsule toner coated on the surface of the record drum is exposed.

Referring to FIG. 3(a), the drum 30, which has the photosensitive microcapsule toner 41 coated on the surface thereof, rotates in the counterclockwise direction. When the drum 30 rotates to the exposing unit 20, the photosensitive microcapsule toner 41 coated on the drum is exposed by the reflecting light of the original document 12. The photosensitive microcapsule toner 41 hardens in response to the irradiating light. As shown in FIG. 3(b), only the exposed photosensitive microcapsule toner 47 on the drum 30 reacts to light and becomes hardened microcapsule toner 47.

Figure 3C:
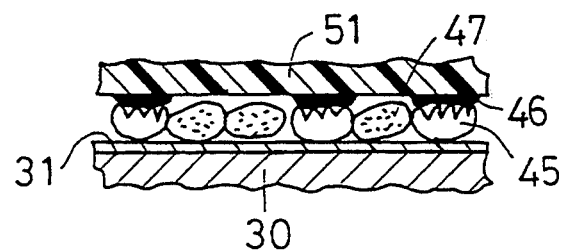
FIG. 3(c) is a cross-sectional view showing that pressure is applied by the pressure roller to the photosensitive microcapsule toner coated on the surface of the recording drum after exposure.

The photosensitive microcapsule toner 41 on the drum 30 is rotated further and reaches the developing unit 50. As shown in FIG. 3(c), when both the hardened photosensitive microcapsules 47 and the non-hardened microcapsules 41 are pressurized and developed by the drum 30 and the pressure roller 51, the non-hardened photosensitive microcapsules 41 are ruptured, and the contents 46 flow out. An image formed of the contents 46, such as coloring material, of the non-hardened photosensitive microcapsule toner 41 is formed on the pressure roller 51. That is, the photosensitive microcapsule toner 41 releases each dye pigment of yellow, magenta or cyan in accordance with a full color image. At this time, the hydrophilic member 31 coated on the recording drum 30 absorbs moisture from air. That is, a small amount of water is coated on the hydrophilic member 31.

The transfer of the photosensitive microcapsule toner 41 which confronts the recording drum 30 is explained. Because the walls 45 of the microcapsule toner particles comprise the hydrophilic materials, the walls 45 are harmonious with moisture. Therefore, the walls 45 adhere to the recording drum 30 on which the hydrophilic member 31 is coated. However, because the contents 46 are hydrophobic, the contents 46 are repulsive to moisture. Therefore, the contents 46 do not adhere to the recording drum 30. Thus, the walls 45 adhere to the recording drum 30, and the contents 46 are separated from the walls 45 and released to the pressure roller 51.

However, the hardened photosensitive microcapsule toner 47 remains on the recording drum 30 with the contents 46 confined in the walls 45 because the contents 46 are not released at all. As a result, an image is formed on the pressure roller 51 by the released contents 46 only.

By the above-explained process, all unnecessary members, such as the hardened photosensitive microcapsule toner 47 and the walls 45 of the ruptured microcapsule toner, for forming an image remain on the drum 30. Therefore, the unnecessary members are never transferred onto the pressure roller 51. Only the contents 46 which are necessary to form an image are released from the drum 30 to the pressure roller 51. The problem of the resultant image that is caused by transferring the walls of the microcapsule toner or the hardened microcapsule toner onto the pressure roller 51 is never caused in the image recording apparatus of this embodiment.

Therefore, output images with high quality can be always obtained. The microcapsule toner 47 and the walls 45 which remain on the drum 30 are removed by the blade 61 as waste microcapsule toner.

Figure 3D:
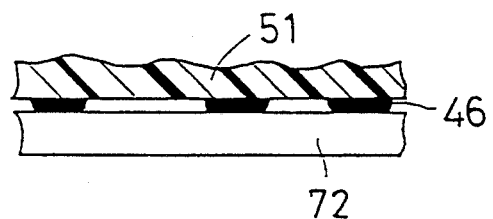
FIG. 3(d) is a cross-sectional view showing that the coloring materials transferred onto the pressure roller are transferred onto the image receiving paper.

If the image receiving paper 72 is fed from the paper cassette 71 by the sending roller 73, the image receiving paper 72 is fed to the gap formed between the pressure roller 51 and the transfer roller 52 in accordance with the feeding guide 75. Since an image is formed on the pressure roller 51 when the paper 72 is fed to the gap between the pressure roller 51 and the transfer roller 52, the image is transferred onto the paper 72, and the image is formed on the paper 72, as shown in FIG. 3(d).

Figure 3E:
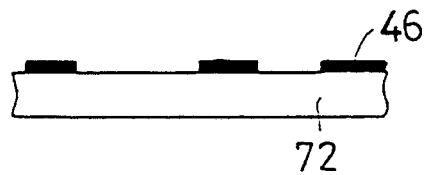
FIG. 3(e) is a cross-sectional view showing that the color materials are transferred onto the image receiving paper.

As shown in FIG. 3(e), the paper upon which the image is formed is fed out of the apparatus in accordance with the feeding guide 75.

As shown in FIG. 1, hydrophobic member 53 can be coated on the surface of the pressure roller 51. By coating the hydrophobic member 53 on the surface of the pressure roller 51, it is possible to effectuate a more complete transfer of the contents 46 of the non-hardened microcapsule toner 41 to the pressure roller 51. As for the hydrophobic member 53, resin materials including a hydrophobic radical such as alkyl radical and phenyl radical can be used. As for the material of the hydrophobic member 53, polypropylene, polyisobutylene, polystyrene and polycarbonate can be used.

Figure 4:
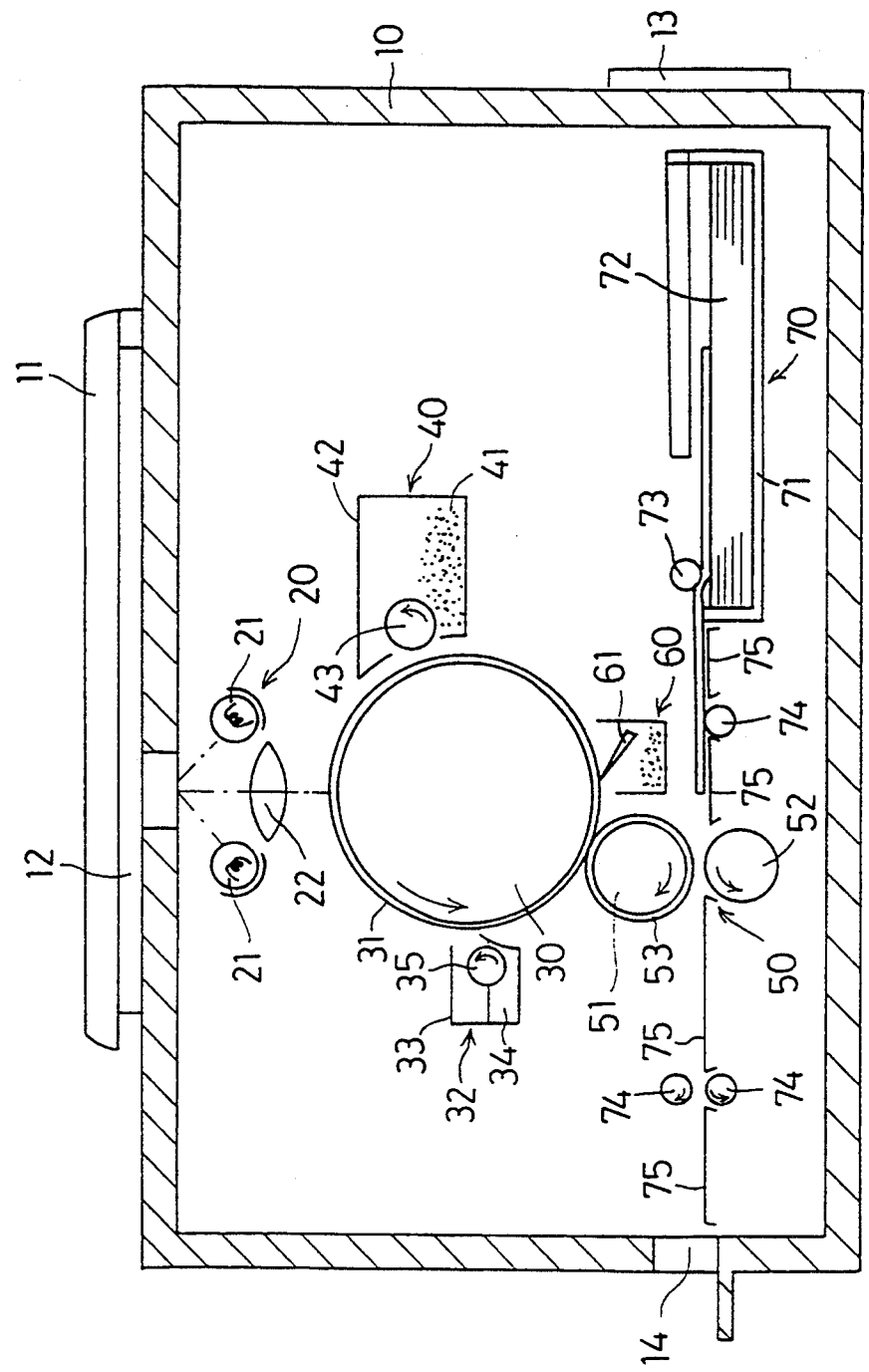
FIG. 4 is a schematic side elevational view of the image recording apparatus of the second embodiment.

Next, a second embodiment is explained by referring FIG. 4. Since the structure of the image recording apparatus of the second embodiment is similar to that of the image recording apparatus of the first embodiment, only the differences will be described in detail.

Although moisture in the air is utilized in the first embodiment, a moisture supplying unit 32 for supplying moisture to the hydrophilic member 31 installed in the second embodiment. With the installation of the moisture supplying unit 32 in the apparatus, a better effect of the separation of the color materials of the non-hardened microcapsule toner 41 from the wall 45 can be obtained.

As shown in FIG. 4, the apparatus of the second embodiment is same as that of the first embodiment except that the moisture supplying unit 32 is installed. The moisture supplying unit 32 comprises a case 33 which stores water 34 therein and a supplying roller 35 for supplying water 34 to the hydrophilic member 31.

For example, the supplying roller 35 is a sponge roller capable of keeping moisture therein.

Next, the operation of the image recording apparatus of the second embodiment is explained. As shown in FIG. 3(b), when the recording drum 30 carrying the photosensitive microcapsule toner 47 which is exposed in accordance with an image is rotated to the moisture supplying unit 32, water 34 is supplied to the drum 30 by rotating the supplying roller 35.

Since the hydrophilic member 31 can be kept in a more hydrophilic state by the supply of water, a more complete separation between the contents 46 of the non-hardened microcapsule toner 41 and the walls 45 can be obtained.

A primary feature of the present invention is that the wall of the photosensitive microcapsule toner particle and the pressure member have a harmonious interaction with moisture, while the contents have a repulsive interaction with moisture. Although the walls and the pressure member are hydrophilic in the above embodiments, the walls and the pressure member can be hydrophobic, and the contents can be hydrophilic. In this case, it is necessary that the image receiving medium has moisture.

A third embodiment of the image recording apparatus is explained by referring FIG. 5. Since the structure of the image recording apparatus of the third embodiment is similar to that of the image recording apparatus of the first embodiment, only the differences will be described in detail.

Hydrophobic member 36 is coated on the surface of the recording drum 30 preferably with a thickness of about 100 $\mu$m or more than 100 $\mu$m.

As for the hydrophobic member 36, resin materials including a hydrophobic radical such as alkyl radical and phenyl radical can be used. As for materials for the hydrophobic member 36, polypropylene, polyisobutylene, polystyrene and polycarbonate can be used.

As for the hydrophilic contents, N-vinyl-2-pyrrolidone, tetraethylene glycol diacrylate, 2 polyethylene glycol di(meth)acrylate can be used.

Hydrophilic member 54 can be coated on the surface of the pressure roller 51. It is possible to more completely transfer the contents 46 of the non-hardened microcapsule toner 41 to the pressure roller 51 by coating the hydrophilic member 54 on the surface of the pressure roller 51.

As for the hydrophilic member 54, for example, resin material including hydrophilic radical such as hydroxyl group, carboxyl group, amino group, ketone group and sulfone radical can be used. As for the material for the hydrophilic member 54, polyurethane, polyamide, polytetra methylen hexamethlene urethane and cellulose acetate can be used.

While advantageous embodiments have been chosen to illustrate the invention, it will be understood by those skilled in the art that various changes and modifications can be made therein without departing from the scope of the invention as defined in the appended claims.

What is claimed is:

1. An image recording apparatus comprising:
   a toner supply supplying charged microcapsule toner particles, each particle including a microcapsule wall having a first hydrological property and flowable contents contained within said wall having a second hydrological property different from said first hydrological property;
   image supporting medium holding said charged microcapsule particles from said toner supply by electrostatic force, said supporting medium having a coating thereon having said first hydrological property;
   an exposure device for exposing said microcapsule particles according to image information; and
   a rupturing device rupturing said microcapsule particles after exposure to release said flowable contents,
   wherein upon rupture said microcapsule particle walls are attracted to said support medium due to the same first hydrological properties and said flowable contents are repulsed by said support medium due to the different first and second hydrological properties.

2. The image recording apparatus of claim 1, wherein said microcapsule particles are photosensitive and said contents are photohardening.

3. The image recording apparatus of claim 1, wherein said first hydrological property is hydrophilic.

4. The image recording apparatus of claim 3, wherein said microcapsule wall and said coating on said supporting medium are made of material having a contact angle with water of 0°–90°.

5. The image recording apparatus of claim 1, wherein said second hydrological property is hydrophobic.

6. The image recording apparatus of claim 5, wherein said flowable contents are made of polymerization compound and coloring material.

7. The image recording apparatus of claim 5, wherein said flowable contents are made of material having a contact angle with water of 90°–180°.

8. The image recording apparatus of claim 1, wherein said first hydrological property is hydrophobic.

9. The image recording apparatus of claim 1, wherein said microcapsule wall and said coating on said supporting medium are made of resin materials including a hydrophobic radical.

10. The image recording apparatus of claim 1, wherein said second hydrological property is hydrophilic.

11. The image recording apparatus of claim 1, wherein said flowable contents are made of resin material including a hydrophilic radical.

12. The image recording apparatus of claim 1, wherein said rupturing device is a pressure roller and has a surface made of material having said second hydrological property thereby attracting said flowable contents due to the same second hydrological properties.

13. The image recording apparatus of claim 1, further comprising a moisture supplying unit adjacent said supporting medium supplying water to said supporting medium.

14. An image recording apparatus comprising:
   image recording means for recording an image thereon;
   image supporting means for supporting an image thereon for recording on said image recording means, said supporting means having a surface with microcapsule toner particles coated thereon, each said microcapsule toner particle comprising a microcapsule wall and flowable contents contained therein, said surface and said microcapsule walls having the same hydrological properties and said flowable contents having an opposite hydrological property than said surface and said walls;

exposure means for forming a latent image of an original on said image supporting means by hardening selected microcapsule toner particles corresponding to an image; and pressure developing means for applying pressure to said image supporting means to rupture non-hardened microcapsule toner particles coated on said image supporting means, wherein the hardening microcapsules and the ruptured microcapsule toner walls remain on said image supporting means due to attraction between the same hydrological properties while only the flowable contents are transferred to said image recording means due to repulsion between the opposite hydrological properties.

15. The image recording apparatus of claim 14, wherein said microcapsule wall and said surface on said supporting means are hydrophilic.

16. The image recording apparatus of claim 14, wherein said microcapsule wall and said coating on said supporting medium are made of resin material having a contact angle with water of 0°–90°.

17. The image recording apparatus of claim 14, wherein said flowable contents are hydrophobic.

18. The image recording apparatus of claim 14, wherein said flowable contents are made of a polymerization compound and coloring material, said flowable contents having a contact angle with water of 90°–180°.

19. The image recording apparatus of claim 14, wherein said microcapsule wall and said coating on said supporting medium are made of hydrophobic material having a contact angle with water of 90°–180°.

20. The image recording apparatus of claim 14, wherein said microcapsule wall and said coating on said supporting medium are made of resin materials including a hydrophobic radical.

21. The image recording apparatus of claim 14, wherein said flowable contents are made of hydrophilic material having a contact angle with water of 0°–90°.

22. The image recording apparatus of claim 14, wherein said flowable contents are made of resin material including a hydrophilic radical.

23. The image recording apparatus of claim 14, wherein said pressure developing means is a pressure roller and has a surface made of material having the same hydrological property as said flowable contents.

24. The image recording apparatus of claim 14, further comprising a moisture supplying means adjacent said supporting means for supplying water to said supporting means.

* * * * *